United States Patent
Russo et al.

(10) Patent No.: US 9,865,369 B2
(45) Date of Patent: Jan. 9, 2018

(54) GRAPHENE-BASED MATERIAL

(71) Applicant: UNIVERSITY OF EXETER, Exeter (GB)

(72) Inventors: Saverio Russo, Exeter (GB); Monica Felicia Craciun, Exeter (GB)

(73) Assignee: University of Exeter, Devon (GB)

( * ) Notice: Subject to any disclaimer, the term of this patent is extended or adjusted under 35 U.S.C. 154(b) by 562 days.

(21) Appl. No.: 13/724,105

(22) Filed: Dec. 21, 2012

(65) Prior Publication Data

US 2014/0174513 A1    Jun. 26, 2014

(51) Int. Cl.
| | | |
|---|---|---|
| *H01B 1/04* | (2006.01) |
| *H01L 31/0224* | (2006.01) |
| *H01L 31/18* | (2006.01) |
| *H01L 51/44* | (2006.01) |

(52) U.S. Cl.
CPC ....... *H01B 1/04* (2013.01); *H01L 31/022466* (2013.01); *H01L 31/1884* (2013.01); *H01L 51/442* (2013.01); *Y02E 10/549* (2013.01); *Y02P 70/521* (2015.11); *Y10T 428/24802* (2015.01); *Y10T 428/30* (2015.01)

(58) Field of Classification Search
CPC ... H01B 1/04; H01L 31/0224; H01L 29/1606; H01M 4/96; H01M 4/587; B82Y 30/00
USPC ...... 252/500–519.1, 521.2; 257/40; 429/221, 429/231.8; 977/734, 948
See application file for complete search history.

(56) References Cited

U.S. PATENT DOCUMENTS

| | | | |
|---|---|---|---|
| 5,376,450 A * | 12/1994 | Greinke et al. | 428/402 |
| 2010/0147188 A1* | 6/2010 | Mamak et al. | 106/31.13 |
| 2010/0206363 A1* | 8/2010 | Choi | 136/252 |
| 2013/0098768 A1* | 4/2013 | Lee et al. | 205/50 |
| 2014/0084252 A1* | 3/2014 | Chen et al. | 257/40 |

OTHER PUBLICATIONS

Khrapach et al. ("Novel Highly Conductive and Transparent Graphene-Based Conductors." Adv Mater, 24, pp. 2844-2849, online Apr. 25, 2012.).*
Zhan et al. ("FeCl 3-Based Few-Layer Graphene Intercalation Compounds: Single Linear Dispersion Electronic Band Structure and Strong Charge Transfer Doping." Adv Funct Mater, 20, pp. 3504-3509, online: Aug. 27, 2010).*
Zhao et al. ("Intercalation of Few-Layer Graphite Flakes with FeCl3: Raman Determination of Fermi Level, Layer by Layer Decoupling, and Stability." JACS, 133, pp. 5941-5946, online Mar. 24, 2011).*
Johnson et al. ("The effects of fecl3 intercalation on the optical properties of multilayer epitaxial graphene." Smartech: http://hdl.handle.net/1853/43771, online May 7, 2012.*
Moon ("Ultra-low resistance ohmic contacts in graphene field effect transistors." AIP, 100, 203512, online May 18, 2012).*
Kim ("Synthesis and Electrical Characterization of Magnetic Bilayer Graphene Intercalate." Nano Lett., 11, 860-865). (Year: 2011).*

* cited by examiner

*Primary Examiner* — Tri V Nguyen
(74) *Attorney, Agent, or Firm* — Andrus Intellectual Property Law, LLP (57) ABSTRACT

The present invention relates to a transparent chemically functionalized graphene with high electrical conductivity and which is stable in air. It also relates to a method of manufacturing a conductive and transparent graphene-based material.

4 Claims, 7 Drawing Sheets

GRAPHENE-BASED MATERIAL

CROSS-REFERENCE TO RELATED APPLICATIONS

N.A.

STATEMENT REGARDING FEDERALLY SPONSORED RESEARCH

N.A.

FIELD OF INVENTION

The present invention relates to a transparent chemically functionalized graphene with high electrical conductivity and which is stable in air. It also relates to a method of manufacturing a conductive and transparent graphene-based material.

BACKGROUND OF THE INVENTION

Indium tin oxide (ITO) is the most widespread transparent conductor in optoelectronic applications. However, the mechanical rigidity of ITO limits its use for flexible devices such as wearable electronics, displays and photovoltaic devices.

Graphene is transparent, conducting and bendable but is also a very strong material. However, the lowest values of graphene's sheet resistance are far above the values of commercially available ITO, i.e. 10 $\Omega/\square$ at an optimal transmittance (Tr) of 85%. Many efforts have been made at decreasing the sheet resistance of graphene-based materials whilst maintaining a high transmittance in order to harness the potential of graphene-based materials in optoelectronic applications. Up until now, the best values of sheet resistance and transmittance of graphene-based materials are still far from the performances of ITO with typical values of sheet resistance being 30 $\Omega/\square$ at a transmittance of 90% for graphene multilayers and 125 $\Omega/\square$ at a transmittance of 97.7% for chemically doped graphene.

In order to replace ITO in optoelectronic applications, it is generally agreed that the replacement material must at least have the properties of commercially available ITO.

Whilst the intercalation of bulk graphite with a large variety of molecules results in a charge transfer and an enhancement of the conductivity, it is not clear whether few-layer graphene materials (FLGs) can also be intercalated by a similar method as well as it is not clear if these intercalation compounds would affect the optical transparency of FLGs. Furthermore, it has been found that most graphite intercalation compounds are unstable in air, with donor compounds being easily oxidised and acceptors being easily desorbed.

Some air stable graphene intercalated compounds can be used but these have to be synthesised in the presence of chlorine gas which is highly toxic and therefore it is undesirable to use those compounds. Further, the intercalation temperature is typically high, more than 500° C., and therefore incompatible with flexible plastic substrates.

SUMMARY OF THE INVENTION

It is an objective of the present invention to provide a highly conductive and transparent graphene-based conductor. However, it is important that the graphene-based conductor is stable upon exposure to air.

The present invention seeks to provide a conductor for optoelectronic applications which have similar or better transparent properties when compared to ITO but which is more flexible than ITO.

The present invention is a highly conductive, transparent graphene-based conductor including a plurality of layers of graphene intercalated with ferric chloride.

The number of graphene layers is preferably two, three, four or five.

The invention also describes a method of making a highly conductive, transparent graphene-based conductor which includes the steps of intercalating few-layer graphene (FLG) with ferric chloride ($FeCl_3$). The few-layer graphene material is obtained by the micromechanical cleavage of flakes from natural graphite on glass or $SiO_2/Si$. The intercalation process with ferric chloride is performed in a vacuum using a two-zone vapour transport method as is described in Advances in Physics, 2002, Volume 51, No. 1 by Dresselhaus.

By carrying out a study of the optical transmission in the visible wavelength range of the $FeCl_3$-FLGs it is shown that the ferric chloride intercalation significantly improves the electrical properties of graphene whilst leaving the optical transparency nearly unchanged when compared to ITO.

The present inventors have found that the Raman spectrum of $FeCl_3$-FLG samples showed no appreciable change on a time scale of up to one year when exposed to air. This property is very important and means that the conductor can be used in applications such as displays and photovoltaic devices.

Further, the intercalation temperature used in the manufacture of the conductor described herein is rather low when compared to other processes which means that the procedure is more environmentally friendly. A preferred temperature range is from around 300 to 360° C.

The present invention also relates to a method of producing a graphene-based conductor according to the present invention and will now be described.

Anhydrous ferric chloride powder and a substrate exfoliated with FLG are positioned in different zones inside a glass tube. The tube is pumped down to $2\times10^{-4}$ mbar at room temperature for one hour to reduce the contamination by water molecules.

The few-layer graphene and the anhydrous ferric chloride powder are heated for approximately seven and a half hours at 360° C. and 310° C., respectively. A heating rate of 10° C. per minute is used during the warming and cooling back to room temperature of the two zones. After the two zones reach room temperature, the system is opened and the sample removed to atmosphere. Ohmic contacts are fabricated on the $FeCl_3$-FLG by means of electron-beam lithography and lift-off of thermally evaporated chrome/gold bilayer (5/50 mm). The $FeCl_3$-FLG can be fabricated on glass or $SiO_2/Si$ substrates. No significant differences in transport properties were noticed between the two types of substrate. The substrates used are approximately 100 μm thick.

This intercalation process has also been successfully used to intercalate FLGs suspended on a transmission electron microscopy grid (TEM grid).

The number of layers of FLG on a $SiO_2/Si$ substrate can be counted by Raman spectroscopy based upon the ratios of the intensities of the G peak and the Si peak. Raman spectroscopy can also be used to characterise the homogeneity of the ferric chloride intercalation in the FLGs after the fabrication of electrical contacts.

BRIEF DESCRIPTION OF DRAWINGS

The invention will now be described with reference to the accompanying drawings.

DETAILED DESCRIPTION OF THE INVENTION

Figure 1A:
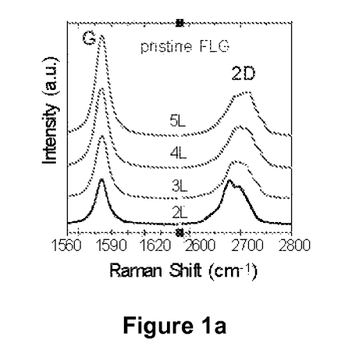
FIG. 1a shows the G and 2D Raman bands of pristine few-layer graphene with different thicknesses ranging from two layers to five layers.

FIG. 1a shows the Raman spectrum of pristine FLGs on $SiO_2$/Si with a G-band at 1580 $cm^{-1}$ and the 2D-band at 2760 $cm^{-1}$. As expected for pristine FLGs, increasing the number of layers results in an increase of the G-band intensity, whereas the 2D-band acquires a multi-peak structure.

Figure 1B:
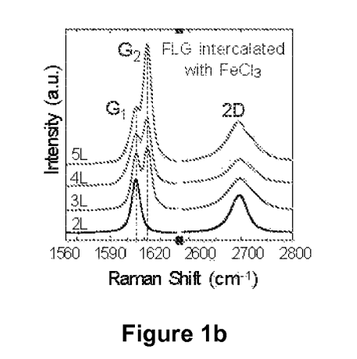
FIG. 1b shows the G and 2D Raman bands of $FeCl_3$-FLG with different thicknesses ranging from two layers to five layers.

FIG. 1b shows the Raman spectrum of $FeCl_3$-FLGs with different thicknesses ranging from two- to five-layers. It can be seen that the charge transfer from $FeCl_3$ to graphene modifies the Raman spectrum of FLGs in two distinctive ways. The first is an upshift of the G-band and the second is a change of the 2D-band from a multi- to a single-peak structure respectively. The shift of the G-band to $G_1$ equals 1612 $cm^{-1}$ is a signature of a graphene sheet with only one adjacent $FeCl_3$ layer, whereas the shift to $G_2$ equals 1625 $cm^{-1}$ characterises a graphene sheet sandwiched between two $FeCl_3$ layers. The frequencies, linewidths and lineshapes of the $G_1$ and $G_2$ peaks do not depend on the number of graphene layers which indicates the decoupling of the FLGs into separate monolayers due to the integration of $FeCl_3$ between the graphene sheets. This is consistent with the changes in the 2D-band shape and with the Raman studies of other intercalants such as potassium and rubidium. From these spectra it is possible to identify the structure of intercalated two-layer samples as one $FeCl_3$ sandwiched between two graphene sheets.

Figure 2:
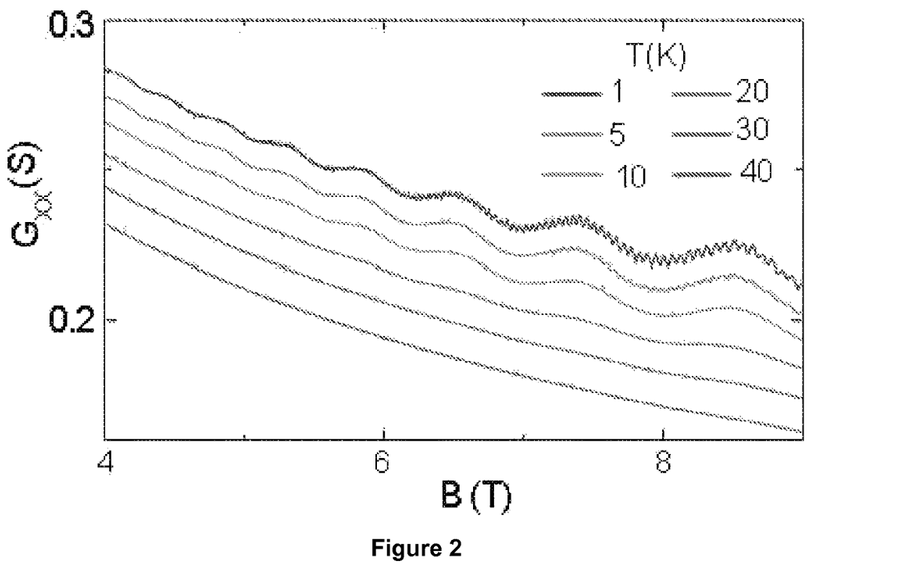
FIG. 2 shows the longitudinal conductance ($G_{xx}$) as a function of magnetic field at different temperatures.

FIG. 2 shows the Shubnikov-de Haas oscillations (SdHO) of $G_{xx}$ as a function of perpendicular magnetic field (B) for different temperatures. It is apparent that for T<10K $G_{xx}$ oscillates with two distinct frequencies. For T>10K only the lower frequency oscillations are visible. These observations indicate that electrical conduction takes place through parallel gases of charged carriers with distinct densities.

Figure 3:
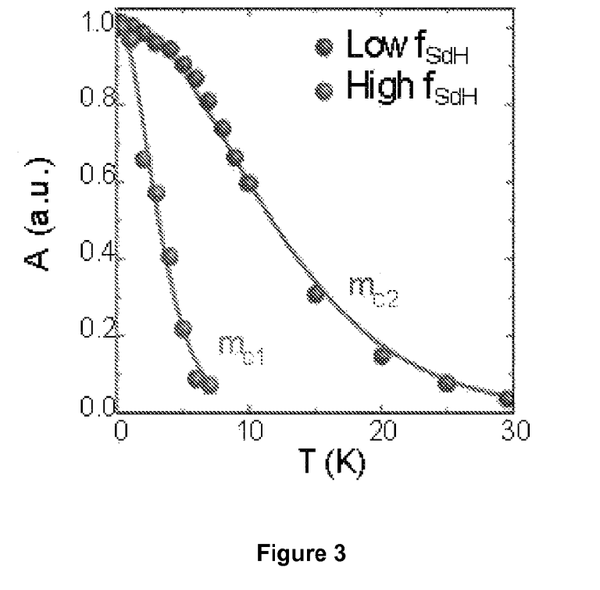
FIG. 3 shows the temperature decay of the amplitude (A) of $\Delta\sigma_{xx}$ oscillations.

FIG. 3 shows the temperature decay of the amplitude of $\Delta\sigma_{xx}$ oscillations at B=6.2 T. The amplitudes are normalised to their values at T=0.25K. The continuous lines are fits to A(T)/A(0.25) with the cyclotron mass $m_c$ as the only fitting parameter. The cyclotron masses are $m_{c1}=(0.25\pm0.05)m_e$ and $m_{c2}=(0.08\pm0.001)m_e$ for the high- and low-frequency oscillations, respectively. These values correspond to the expected values of cyclotron mass for massless Dirac fermions and for chiral massive charge carriers of bilayer graphene. From this information it can be deduced that the intercalation of $FeCl_3$ decouples the stacked five-layer graphene into parallel gases of massless (one-layer) and massive (two-layer) charge carriers.

Figure 4:
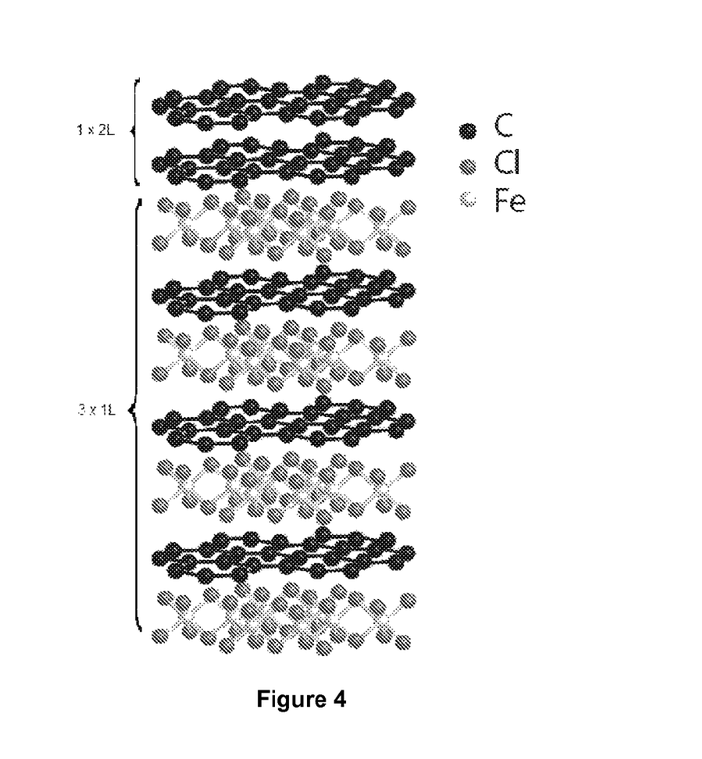
FIG. 4 is a schematic crystal structure of a five-layer $FeCl_3$-FLG.

FIG. 4 shows a schematic of the crystal structure of a five-layer $FeCl_3$-FLG in which electrical transport takes place through four parallel conductive planes, one with bilayer character and three with monolayer character. Electrical transport characterisation demonstrates the presence of all four parallel hole gases, of which one with bilayer character and three with monolayer character. These findings are confirmed by the Raman spectra taken after the device fabrication showing the presence of pristine G, $G_1$ and $G_2$ peaks. The bilayer gas is likely to be caused by the first two layers of the stacking which have been de-intercalated due to rinsing in acetone, as rinsing in acetone is known to remove ferric chloride from the surface of the graphene. The bottom part of the stacking has a per-layer doping of $n_1=1.07\times10^{14}$ $cm^{-2}$ and the stoichiometry of stage-1 ferric chloride graphite intercalation compounds, i.e. where each graphene layer is sandwiched by two ferric chloride layers. The inventors have investigated the electrical transport and Raman spectroscopy in more than ten intercalated five-layer samples and in all cases it was confirmed that the structure is the same as is shown in FIG. 4.

Figure 5:
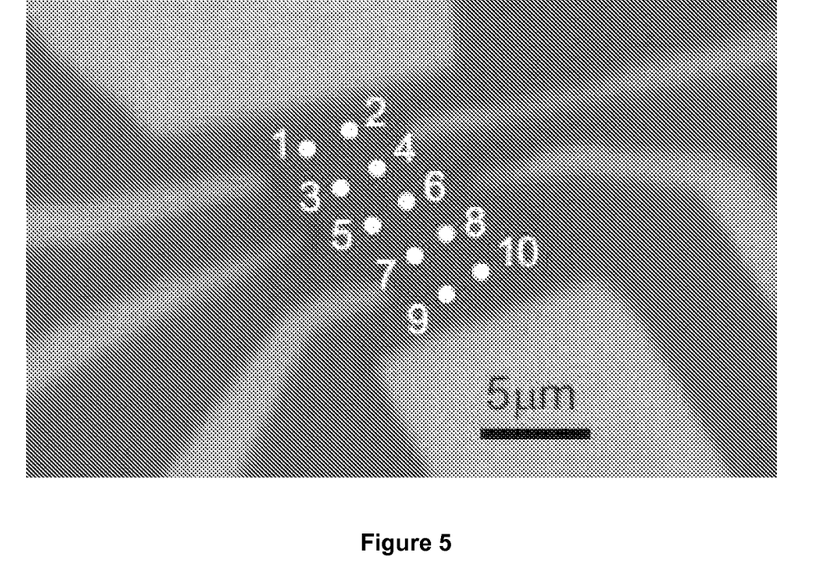
FIG. 5 is an optical image of the five-layer $FeCl_3$-FLG shown in FIG. 4.

FIG. 5 shows an optical image of the five-layer $FeCl_3$-FLG with ten locations highlighted on the device.

Figure 6:
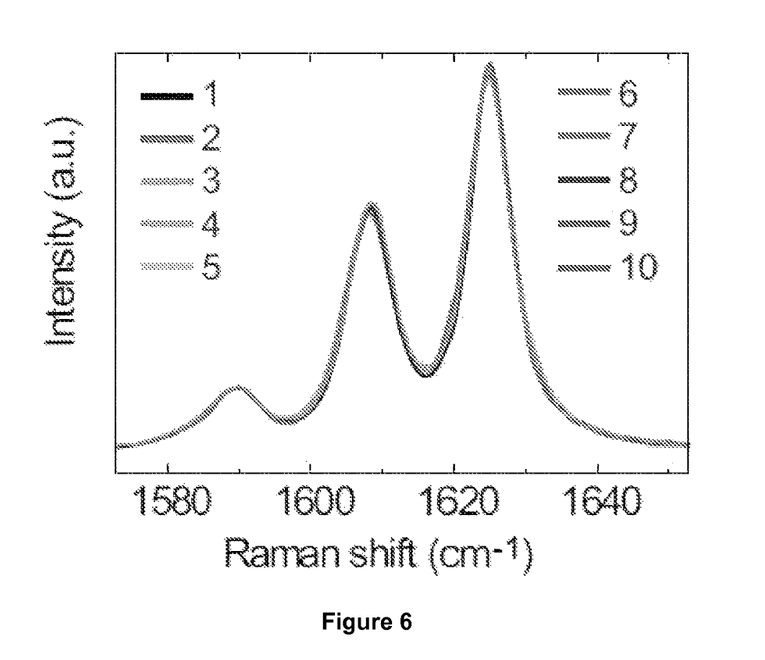
FIG. 6 are Raman spectra of a five-layer $FeCl_3$-FLG device taken at different locations as indicated in FIG. 5.

FIG. 6 shows a comparison of the Raman spectra measured at the ten difference locations shown in the previous figure. It can be seen that there is no appreciable variation in either the intensity or the position of the Raman peaks. This demonstrates that the intercalated flakes have a high homogeneity, i.e. the structure is the same at any point of the flake. In particular, the peak at 1590 $cm^{-1}$ is the G-peak and its presence implies that at least one graphene plane has no adjacent layers of $FeCl_3$. The peaks at 1612 $cm^{-1}$ and at 1625 $cm^{-1}$ correspond to a uniform layer of intercalant on one side of the graphene and on both sides of the graphene, respectively. The fact that the flake has three single-layer intercalated planes and one bilayer plane is also supported by the Shubnikov-de Haas oscillations of the longitudinal conductivity in strong magnetic field.

Figure 7A:
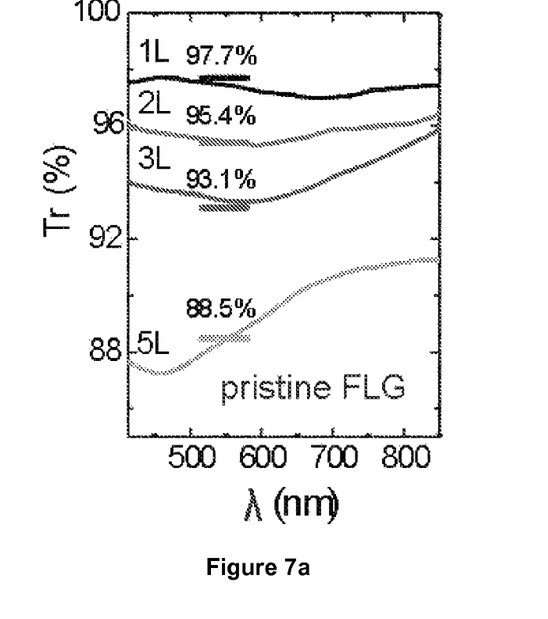
FIG. 7a shows the transmittance spectrum of pristine FLG.
Figure 7B:
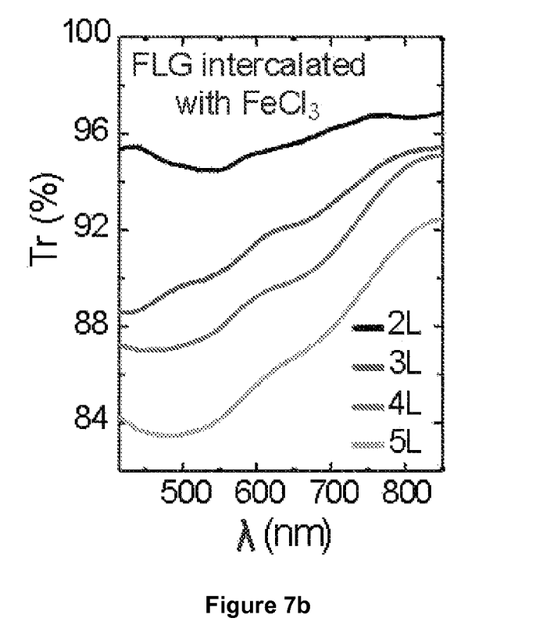
FIG. 7b shows the transmittance spectrum of $FeCl_3$-FLG.
Figure 8A:
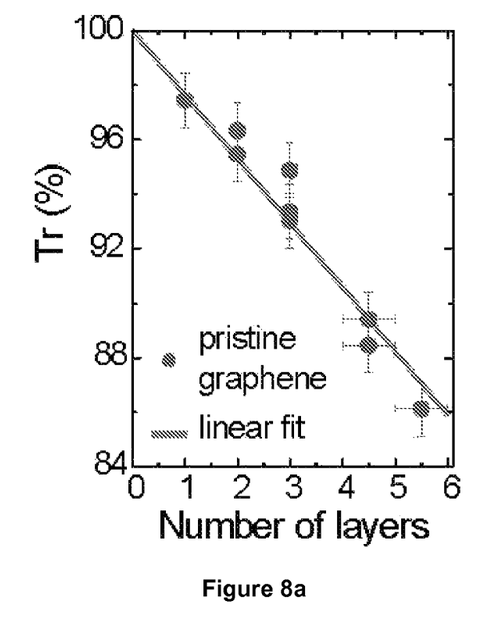
FIG. 8a shows the transmittance at 550 nm of pristine FLG as a function of the number of layers.
Figure 8B:
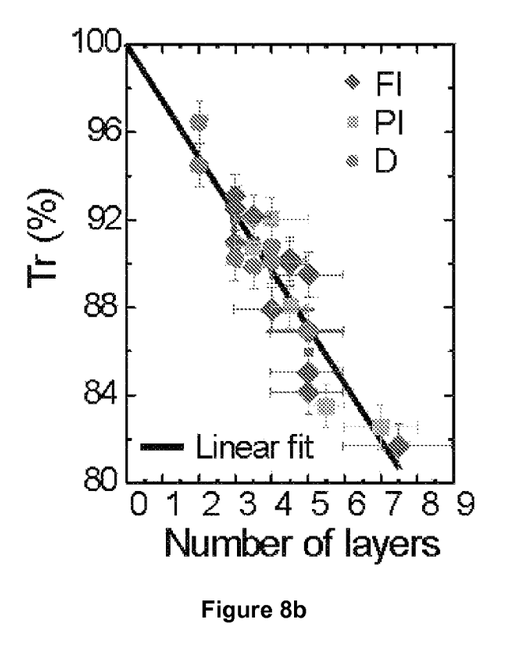
FIG. 8b shows the transmittance at 550 nm for fully integrated $FeCl_3$-FLG, partially integrated $FeCl_3$-FLG and doped $FeCl_3$-FLG as a function of the number of layers.

FIGS. 7a and 7b show a comparison between the transmittance spectra of pristine few-layer graphene and $FeCl_3$-FLG. The horizontal lines in FIG. 7b are the corresponding transmittances at the wavelength of 550 nm reported in the literature. The transmittance values of pristine FLG at the wavelength of 550 nm are in agreement with the expected values highlighted in FIG. 7a, and with the results reported by other research groups. Upon intercalation, the transmittance slightly decreases at low wavelengths, but it is still above 80%. In order to measure an accurate value of transmittance, it has been fitted with a linear dependence on the number of layers for a statistical ensemble of flakes FIG. 8a shows the transmittance at 550 nm for pristine FLG as a function of the number of layers of graphene. The diagonal line passing through some of the points is a linear fit which gives the extinction coefficient of 2.4±0.1% per layer. FIG. 8b shows the transmittance at 550 nm for fully intercalated $FeCl_3$-FLG (FI), partially intercalated $FeCl_3$-FLG (PI) and doped $FeCl_3$-FLG (D) as a function of the number of layers. The diagonal line is a linear fit with the extinction coefficient of 2.6±0.1% per layer.

Figure 9:
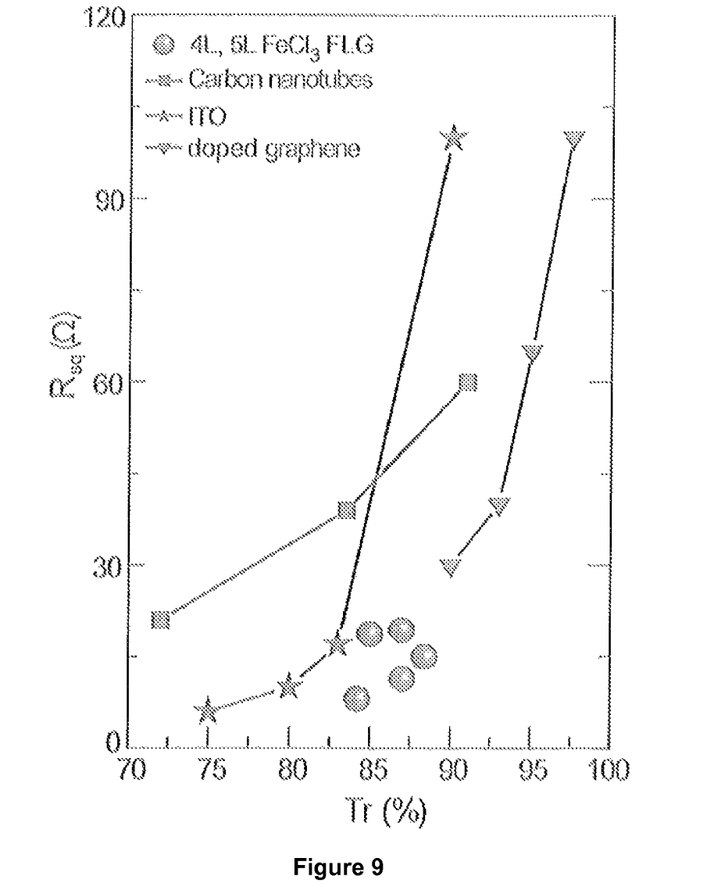
FIG. 9 is the square resistance versus transmittance at 550 nm for four-layer and five-layer $FeCl_3$-FLG, ITO, carbon-nanotube films and doped graphene materials.

FIG. 9 shows the square resistance against transmittance at 550 nm for four-layer and five-layer $FeCl_3$-FLG, ITO, carbon-nanotube films and doped graphene materials. It is apparent that the sheet resistance and transmittance of $FeCl_3$-FLG outperform the current limits of ITO and shows one of the best values reported so far for doped graphene. Therefore, the outstanding high electrical conductivity and optical transparency makes $FeCl_3$-FLG materials the best transparent conductors for optoelectronic devices. For wavelengths longer than 550 nm, an increase in the optical transparency of $FeCl_3$-FLG has been observed. This is a significant advantage of the new material described herein compared to ITO, whose transparency decreases for wavelengths longer than 600 nm. This property will prove useful in applications that require conductive electrodes which are transparent both in visible and near infrared range. For instance, $FeCl_3$-FLG transparent electrodes could be used for solar cells to harvest energy over an extended wavelength range as compared to ITO-based devices, or for electromagnetic shielding.

Figure 10A:
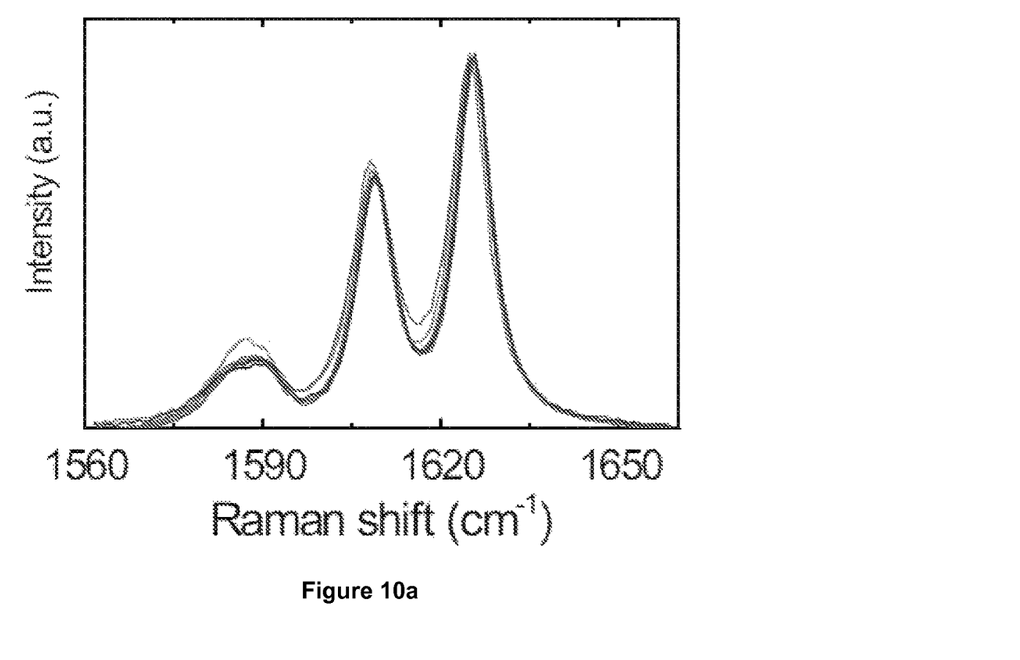
FIG. 10a shows the Raman spectrum of five-layer $FeCl_3$-FLG device taken at different locations at three months after manufacture.
Figure 10B:
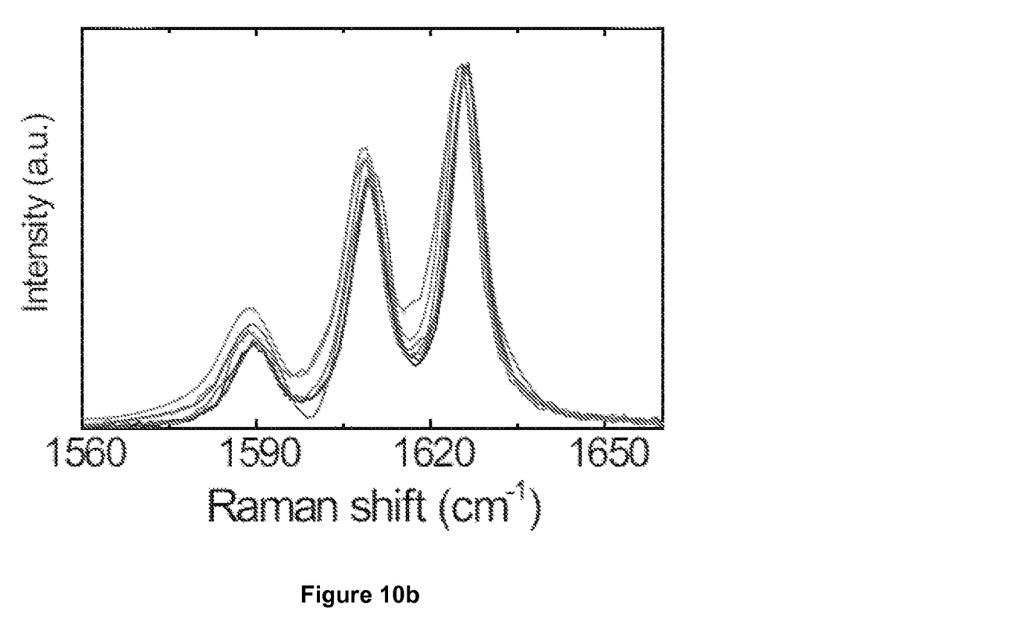
FIG. 10b shows the Raman spectrum of a typical five-layer $FeCl_3$-FLG device taken at different locations one year after manufacture.

FIGS. 10a and 10b show Raman spectra of a typical five-layer $FeCl_3$-FLG device taken at different locations on the flake three months and one year after the manufacture of the sample which was kept in air in standard environmental conditions. It is apparent from the spectra that there is no appreciable change, which demonstrates that $FeCl_3$-FLG intercalated devices are stable in air.

A record low sheet resistance of 8.8 Ω/□ is attained together with an optical transmittance higher than 84% in the visible range. These parameters outperform the best values of ITO and of other carbon-based materials. The $FeCl_3$-FLG's materials are relatively inexpensive to make and they are easily scalable to industrial production of large area electrodes. Contrary to the numerous chemical species that can be intercalated into graphite, many of which are unstable in air, it has been found that $FeCl_3$-FLGs are air stable on a timescale of at least one year.

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference in their entirety for all purposes.

We claim:

1. A highly conductive, transparent graphene-based conductor including a plurality of three, four or five layers of graphene intercalated with anhydrous ferric chloride on a substrate, the conductor having Ohmic contacts fabricated thereon.

2. A conductor according to claim 1 wherein the substrate is glass, $SiO_2$/Si or a TEM grid.

3. A conductor according to claim 1 having a sheet resistance of 8.8 Ω/□.

4. A conductor according to claim 3 wherein the conductor has an optical transmittance of 84% or higher in the visible range.

* * * * *